United States Patent
Pinarbasi et al.

(10) Patent No.: US 10,651,370 B2
(45) Date of Patent: *May 12, 2020

(54) PERPENDICULAR MAGNETIC TUNNEL JUNCTION RETENTION AND ENDURANCE IMPROVEMENT

(71) Applicant: Spin Memory, Inc., Fremont, CA (US)

(72) Inventors: Mustafa Pinarbasi, Morgan Hill, CA (US); Bartlomiej Adam Kardasz, Pleasanton, CA (US); Jorge Vasquez, San Jose, CA (US); Thomas D. Boone, San Carlos, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/859,224

(22) Filed: Dec. 29, 2017

(65) Prior Publication Data

US 2019/0207096 A1 Jul. 4, 2019

(51) Int. Cl.

| G11C 11/00 | (2006.01) |
| H01L 43/08 | (2006.01) |
| G11C 11/16 | (2006.01) |
| H01F 10/32 | (2006.01) |
| H01L 43/02 | (2006.01) |
| H01L 27/22 | (2006.01) |
| H01L 43/10 | (2006.01) |

(52) U.S. Cl.
CPC ............ *H01L 43/08* (2013.01); *G11C 11/161* (2013.01); *G11C 11/1675* (2013.01); *H01F 10/3286* (2013.01); *H01L 27/222* (2013.01); *H01L 43/02* (2013.01); *H01L 43/10* (2013.01); *H01F 10/329* (2013.01)

(58) Field of Classification Search
CPC ....... H01L 43/08; H01L 27/222; H01L 43/02; G11C 11/161; G11C 11/1675; H01F 10/3286; H01F 10/329
USPC .......................................... 365/158, 171, 173
See application file for complete search history.

(56) References Cited

U.S. PATENT DOCUMENTS

| 9,741,926 B1 * | 8/2017 | Pinarbasi | H01L 43/08 |
| 2012/0313191 A1 * | 12/2012 | Whig | H01L 43/08 257/421 |
| 2014/0001586 A1 * | 1/2014 | Shen | H01L 43/10 257/421 |
| 2014/0319521 A1 * | 10/2014 | Uchida | H01L 27/228 257/43 |
| 2015/0340598 A1 * | 11/2015 | Gan | H01L 43/08 257/421 |

(Continued)

*Primary Examiner* — Huan Hoang
(74) *Attorney, Agent, or Firm* — Zilka-Kotab, P.C.

(57) ABSTRACT

A magnetic data recording element for magnetic random access memory data recording. The magnetic data recording element includes a magnetic tunnel junction element that includes a magnetic reference layer, a magnetic free layer and a non-magnetic barrier layer located between the non-magnetic reference layer and the magnetic free layer. The magnetic free layer includes a layer of Hf that causes the magnetic free layer to have an increased perpendicular magnetic anisotropy. This increased perpendicular magnetic anisotropy improves data retention and increases thermal stability, by preventing the magnetization of the magnetic free layer from inadvertently losing its magnetic orientation.

14 Claims, 6 Drawing Sheets

(56) References Cited

U.S. PATENT DOCUMENTS

2019/0006414 A1\* 1/2019 Huai .................... G11C 11/161

\* cited by examiner

PERPENDICULAR MAGNETIC TUNNEL JUNCTION RETENTION AND ENDURANCE IMPROVEMENT

FIELD OF THE INVENTION

The present invention relates to magnetic random access memory (MRAM) and more particularly to a perpendicular magnetic tunnel junction element having a free layer that incorporates a layer of Hf for improved data retention and thermal stability.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When, the orientations of the magnetizations of the free and reference layer are oriented in the same direction, the spin of the electrons in the free layer are in generally the same direction as the orientation of the spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a magnetic random access memory element that includes a magnetic free layer, a magnetic reference layer and a non-magnetic barrier layer located between the magnetic free layer and the magnetic reference layer. The magnetic free layer includes at least one magnetic layer and a layer of Hf.

The magnetic free layer can be configured as first and second magnetic layers and a spacer layer located between the first and second magnetic layers. The layer of Hf can be incorporated with the spacer layer or could be configured as a capping layer located at the top of the magnetic free layer at a location that is opposite the non-magnetic barrier layer.

The presence of the layer of Hf advantageously increases the perpendicular magnetic anisotropy of the magnetic free layer. This increase in perpendicular magnetic anisotropy increases data retention and improves thermal stability of the memory element.

The layer of Hf can be included along with other layers, which may include one or more of a layer of W and/or a layer of MgO. For example, the spacer layer can include a layer of W and the layer of Hf, or could include a layer of Mg—O and the layer of Hf. Alternatively, the layer of Hf could be part of a capping layer structure that includes a layer of Mg—O and the layer of Hf.

The layers of the spacer layer are configured to be sufficiently thin to maintain exchange coupling between the first and second magnetic layers of the magnetic free layer. For example, the layer of the spacer layer can have a thickness that is not greater than 6 Angstroms. In this way, the magnetic layers of the magnetic free layer act as a single magnetic unit, having magnetizations that remain oriented in the same direction as one another and which move in unison during data switching.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
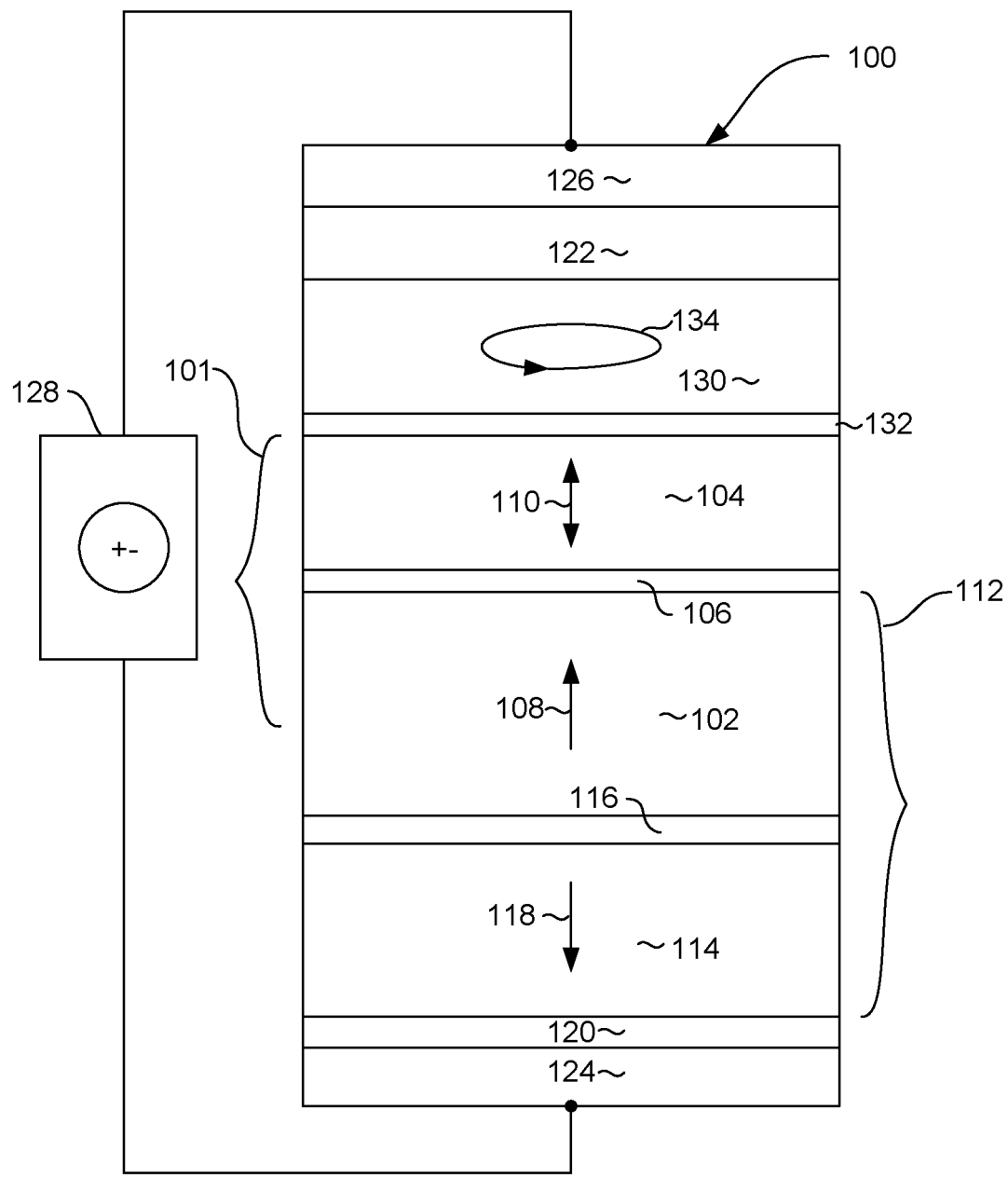
FIG. 1 is a schematic, cross sectional view of a perpendicular magnetic tunnel junction (pTMR) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as Mg—O The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it ferromagnetically antiparallel couples the layers 114, 102.

The antiparallel coupling between the layers 114, 102 pins the magnetization 108 of the reference layer 102 in a second direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Cu and can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. Because the magnetization 110 of the free layer 104 is in the same direction as the magnetization 108 of the reference layer 102, the electrons with opposite spin will not be able to pass through the barrier layer 106 into the reference layer 108. As a result, the electrons with the opposite spin will accumulate at the junction between the free layer 104 and barrier layer 106. This accumulation of spin polarized electrons causes a spin torque that causes the magnetization 110 of the free layer 104 to flip from an upward direction to a downward direction.

In order to assist the switching of the magnetization 110 of the free layer 104, the memory element 100 may include a spin polarization structure 130 formed above the free layer 104. The spin polarization layer can be separated from the free layer 104 by an exchange coupling layer 132. The spin polarization structure 130 has a magnetic anisotropy that causes it to have a magnetization 134 with a primary component oriented in the in plane direction (e.g. perpendicular to the magnetizations 110, 108 of the free and reference layers 104, 102. The magnetization 134, of the spin polarization layer 130 may either be stationary or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

As discussed above, the magnetic free layer 104 has a magnetization 110 that moves between two states that are both perpendicular to the plane of the magnetic free layer 104. Data retention refers to the ability of a magnetic recording system maintain the recorded data for a long period of time. The longer the free layer can keep the data stored without loss of data, the higher the data retention is. In order to maintain good data retention, the magnetic orientation 110 of the magnetic freer layer 104 must remain in the recorded direction. This especially challenging at higher operating temperatures, which can cause a reduction in magnetic stability of the magnetic free layer 104. Increasing the magnetic anisotropy of the magnetic free layer 104 in a direction that is perpendicular to the plane of the magnetic free layer 104 can increase the magnetic stability of the magnetic free layer 104, thereby improving data retention, even at high temperatures.

The present invention improves data retention and thermal stability of the free layer 104 by constructing the magnetic free layer 104 with an increased Perpendicular Magnetic Anisotropy (PMA). This can be achieved through the use of novel, thin spacer layers formed in the magnetic free layer 104, which affects the crystalline structure so as to provide an increased free layer PMA, thereby resulting in improved data retention and thermal robustness.

It has been found that the addition of a layer of Hf into the free layer 104 can increase the Perpendicular Magnetic Anisotropy of free layer 104 to provide improved data retention and thermal stability. Various different structures can be used to incorporate such a Hf layer into the free layer 104.

Figure 2:
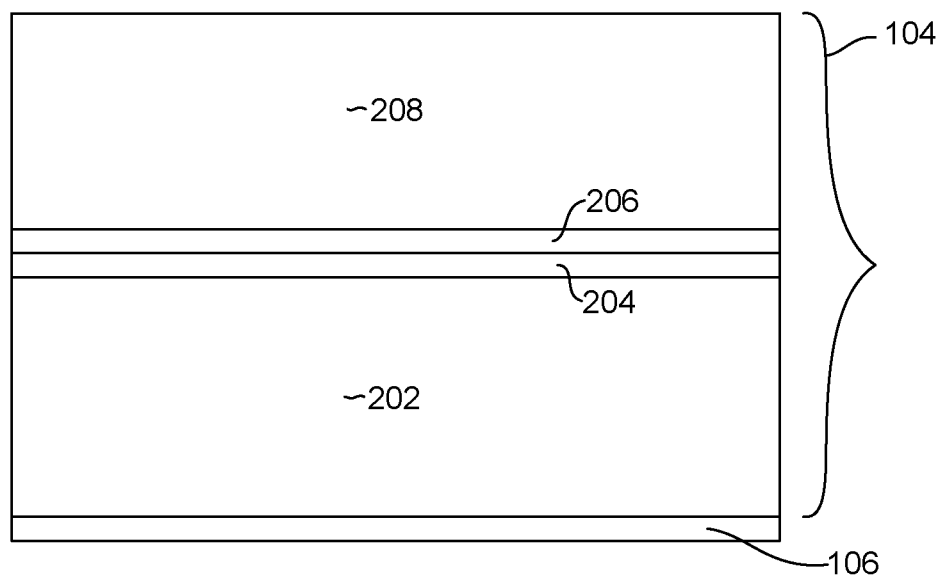
FIG. 2 is an enlarged view of a magnetic free layer structure according to an embodiment of the invention.

For example, FIG. 2 shows an enlarged view of a possible structure of a magnetic free layer 104, such as can be used in the magnetic recording element 100 of FIG. 1. FIG. 2, shows a barrier layer 106 on which the free layer 104 can be formed. The magnetic free layer 104 includes first and second magnetic layers 202, 208 with a pair of non-magnetic spacer layers 204, 206 located between the magnetic layers 202, 208.

The first and second magnetic layers 202, 208 can be constructed of a material such as CoFeB. The first spacer layer 204, can be constructed of Hf and the second spacer layer 206 can be constructed of another material such as W. The layers 204, 206 are sufficiently thin that they do not affect the exchange coupling between the first and second magnetic layers 202, 208. That is, the first and second magnetic layers 202, 208 act magnetically as a single magnetic layer in that the magnetizations of both layers are in the same direction, either both in an upward direction, both in a downward direction or both in the same transition state moving between upward and downward directions.

To maintain this exchange coupling between the magnetic layers 202, 208, the spacer layers 204, 206 are preferably made as thin as possible while still being sufficiently thick to provide the desired increase in perpendicular magnetic anisotropy to the free layer 104 as a whole. To this end, the layers 204, 206 can have a thickness of 1-6 Angstroms. In, the embodiment shown in FIG. 2 it can be seen that the spacer layers 202, 206 are both located within the free layer structure 104, near the center of the free layer structure 104. In the structure shown in FIG. 2, the first spacer layer 204, which is the layer closest to the barrier layer 106 is a layer of Hf, and the second layer 206 is W and is further from the barrier layer 106. The two spacer layers 204, 206 are directly in contact with one another between the magnetic layers 202, 208.

Figure 3:
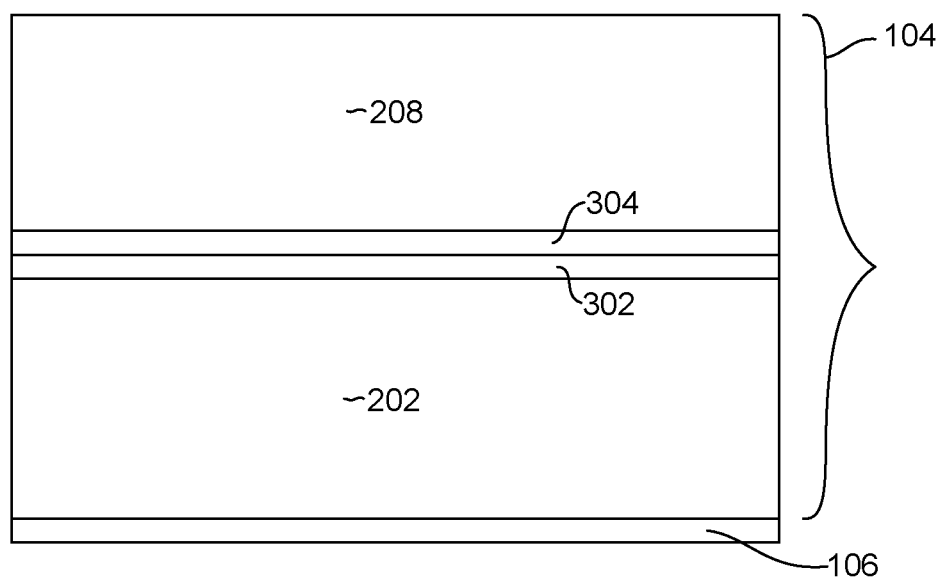
FIG. 3 is an enlarged view of a magnetic free layer structure according to an alternate embodiment of the invention.

FIG. 3 shows another embodiment that also provides improved perpendicular magnetic anisotropy for improved data retention and thermal stability. In FIG. 3, the free layer structure includes first and second magnetic layers 202, 208 and a spacer layer structure including first and second layers 302, 304 located between the magnetic layers 202, 208. As with the previously described embodiment, the magnetic layers 202, 208 can be a material such as CoFeB. The first spacer layer 302, which is located closest to the barrier layer 106 can be constructed of W, while the second spacer layer 304, located further from the barrier layer 106 can be Hf. Again, the spacer layers 302, 304 are sufficiently thin so as to not break exchange coupling between the magnetic layers 202, 208. Each of the spacer layers 302, 304 can be less than 6 Angstroms thick, such as 1-6 Angstroms thick.

Figure 4:
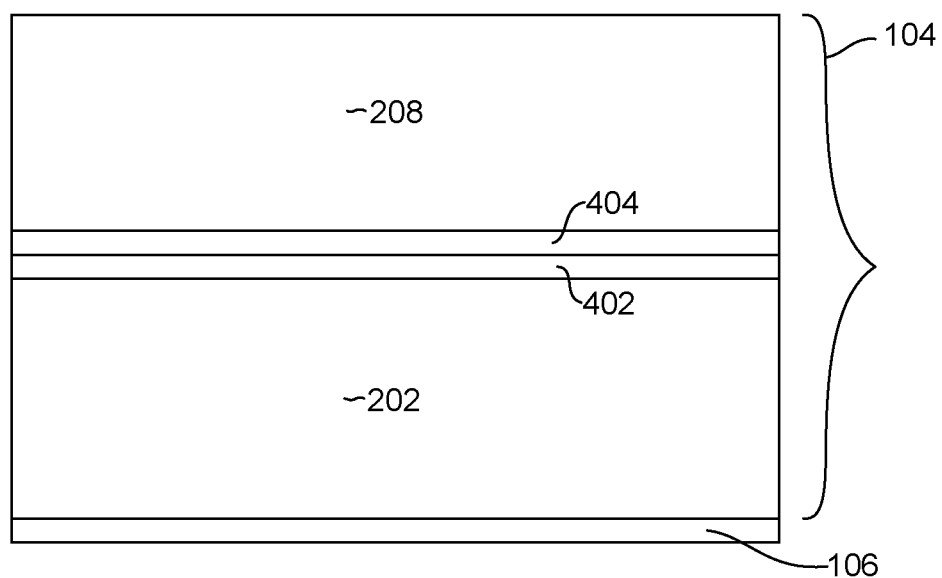
FIG. 4 is an enlarged view of a magnetic free layer structure according to yet another embodiment of the invention.

FIG. 4 illustrates a magnetic free layer structure 104 according to another embodiment. The magnetic free layer structure 104 of FIG. 4 includes first and second magnetic layers 202, 208 and non-magnetic spacer layers 402, 404 located between the magnetic free layers. The magnetic free layers 202, 208 can be constructed of, for example, CoFeB. The first spacer layer 402, located closest to the barrier layer 106 can be constructed of Hf, while the second spacer layer 404 located further from the barrier layer 106 can be constructed of Mg—O. Again, the layers 402, 404 are sufficiently thin as to not break exchange coupling between the magnetic layers 202, 208. The first spacer layer 402 can have a thickness of 1-6 Angstroms, and the second spacer layer 404 can have a thickness of 1-6 Angstroms.

Figure 5:
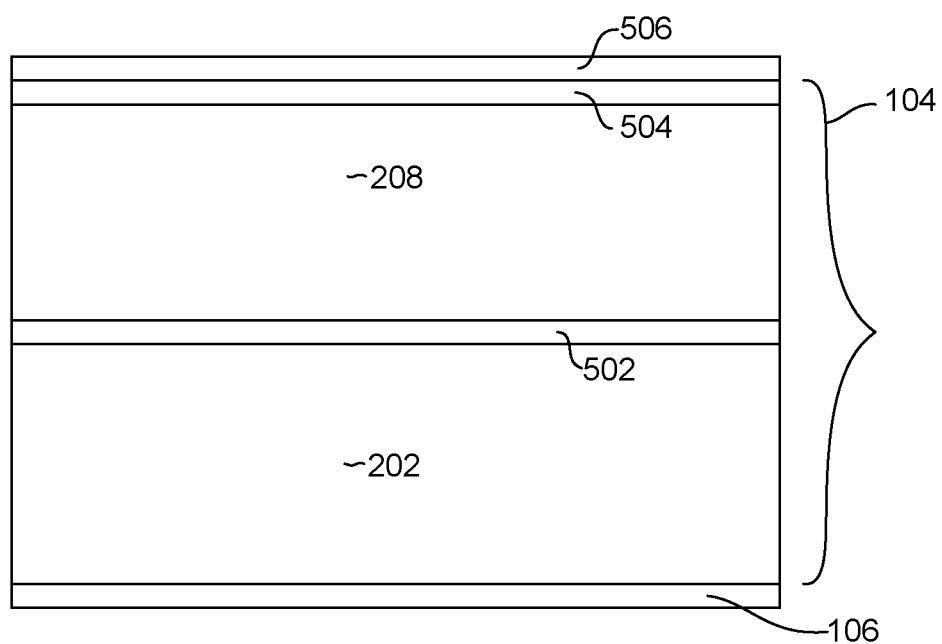
FIG. 5 is an enlarged view of a magnetic free layer structure according to still another embodiment of the invention.

FIG. 5 illustrates a magnetic free layer according to yet another embodiment of the invention. As shown in FIG. 5, the magnetic free layer 104 includes first and second magnetic layers 202, 208 that can be constructed of a material such as CoFeB. A non-magnetic spacer layer 502 is located between the magnetic layers 202, 208. Another non-magnetic layer 504 is formed at the top of the magnetic free layer structure 104, the non-magnetic layer 504 being at the furthest point away from the barrier layer 106. The non-magnetic layer 502 can be constructed of W. Again, the layer 502 is of sufficiently thin so as to not break exchange coupling between the magnetic layers 202, 208. The non-magnetic layer 502 can have a thickness of 1-6 Angstroms. The upper non-magnetic layer 504 can be constructed of Hf. In this case, the layer 504 may be considered to be a capping layer. In addition, a capping layer such as Mg—O 506 may be provided above the layer 504. Although the Hf layer 504 is not formed within the magnetic free layer structure 104, but rather at an upper end of the free layer structure 104, it still functions to increase the perpendicular magnetic anisotropy of the free magnetic layer 104. The Hf layer 504 can have a thickness of 1-6 angstroms. A capping layer such as Mg—O 506 can be formed over the layer 504.

Figure 6:
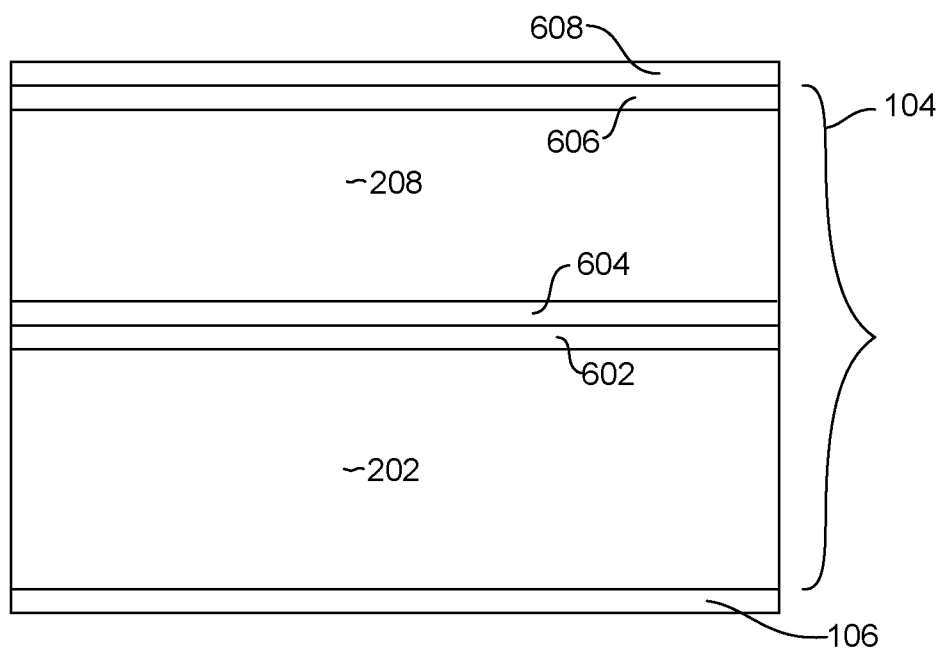
FIG. 6 is an enlarged view of a magnetic free layer structure according yet another embodiment of the invention.

FIG. 6 illustrates a magnetic free layer 104 according to yet another embodiment. The magnetic free layer 104 of FIG. 6 includes first and second magnetic layers 202, 208, which can be constructed of CoFeB. A pair of non-magnetic spacer layers 602, 604 are located between the magnetic layers 202, 208. The first non-magnetic spacer layer 602 can be constructed of Hf, while the second non-magnetic spacer layer 604 can be constructed of Mg—O. Again, the layers 602, 604 are sufficiently thin to not break exchange coupling between the magnetic layers 202, 208. The first non-magnetic spacer layer 602 (located closest to the barrier layer) can have a thickness of 1-6 Angstroms, and the second non-magnetic spacer layer 604 (located further from the barrier layer 106) can have a thickness of 2-6 Angstroms. In addition to the layers 602, 604, a layer of Hf 606 can be formed at the top of the magnetic free layer structure 104. Again, the presence of the Hf layer 606 increases the perpendicular magnetic anisotropy of the magnetic free layer 104 so as to increase data retention and thermal stability. A capping layer such as Mg—O 608 may be formed over the Hf layer 606.

The above descriptions illustrate various different configurations for introducing a thin layer of Hf into a magnetic free layer structure 106 to thereby increase the perpendicular magnetic anisotropy of the free layer. This increase in perpendicular magnetic anisotropy improves data retention and thermal stability, resulting in improved data recording performance and reliability. In addition, by increasing the perpendicular magnetic anisotropy, the thickness of the magnetic layers in the free layer can be increased. This increase in thickness can be optimized to increase TMR ratio for improved data recording performance, without sacrificing free layer stability. Increasing the TMR can enhance the efficiency (retention/switching current) of the MTJ which in turn can operate at more optimum voltage (current) levels. The lower operation voltage in turn will increase the endurance (number of write operations without barrier breakdown) of the MTJ layer.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A magnetic random access memory element comprising:
   a magnetic reference layer;
   a magnetic free layer; and
   a non-magnetic barrier layer, located between the magnetic reference layer and the magnetic free layer;
   the magnetic free layer comprising a magnetic material, a layer of Hf, and a layer of W, wherein the layer of layer of Hf and the layer of W contact one another, the layer of Hf and the layer of W both contact the magnetic material; wherein
   the layer of Hf and the layer of W each have a thickness of 1-6 Angstroms.

2. The magnetic random access memory element as in claim 1, further comprising a layer of Mg—O formed over the magnetic free layer at a location opposite the non-magnetic barrier layer.

3. The magnetic random access memory element as in claim 1 further comprising a layer of Mg—O.

4. The magnetic random access memory element as in claim 1 wherein the magnetic free layer further comprises a layer of Mg—O and wherein the layer of Mg—O has a thickness of 2-6 Angstroms.

5. A magnetic random access memory element, comprising:
   a magnetic reference layer;
   a magnetic free layer; and
   a non-magnetic barrier layer disposed between the magnetic reference layer and the magnetic free layer;
   wherein the magnetic free layer comprises:
   a first magnetic layer;
   a second magnetic layer;
   a spacer layer located between the first magnetic layer and the second magnetic layer, the spacer layer comprising a layer of Hf in contact with the first magnetic layer and a layer of W in contact with the second magnetic layer;
   wherein each of the layer of Hf and the layer of W have a thickness of 1-6 Angstroms.

6. The magnetic random access memory element as in claim 5, wherein the layer of Hf and the layer of W contact one another.

7. The magnetic random access memory element as in claim 5, wherein the spacer layer includes a layer of Mg—O.

8. The magnetic random access memory element as in claim 5, wherein the spacer layer is sufficiently thin to maintain exchange coupling between the first and second magnetic layers.

9. The magnetic random access memory element as in claim 5, wherein the layer of W is located between the layer of layer of Hf and the non-magnetic barrier layer.

10. The magnetic random access memory element as in claim 5, wherein the spacer layer has a total thickness not greater than 6 nm.

11. The magnetic random access memory element as in claim 5, further comprising a cap layer formed over the magnetic free layer, the cap layer including a layer of Mg—O and a layer of Hf.

12. A magnetic random access memory system, comprising:
   a memory element that includes a magnetic reference layer, a magnetic free layer and a non-magnetic barrier layer located between the magnetic reference layer and the magnetic free layer; and
   circuitry electrically connected with the memory element, the circuitry being functional to supply a current to the magnetic element to write a data bit to the magnetic memory element and to measure an electrical resistance of the memory element to read a data bit from the memory element;
   wherein the magnetic free layer further comprises:
   first and second magnetic layers and a spacer layer located between the first and second magnetic layers, the spacer layer comprising a layer of Hf in contact with the first magnetic layer and a layer of W in contact with the layer of Hf and also in contact with the second magnetic layer; wherein each of the layer of Hf and the layer of W have a thickness of 1-6 Angstroms.

13. The magnetic random access memory system as in claim 12, further comprising a cap layer including a layer of Hf located over the magnetic free layer.

14. The magnetic random access memory system as in claim 12 further comprising a cap layer formed over the magnetic free layer, the cap layer comprising a layer of Hf and a layer of W.

\* \* \* \* \*